US012398452B2

(12) United States Patent
Chen et al.

(10) Patent No.: US 12,398,452 B2
(45) Date of Patent: Aug. 26, 2025

(54) METAL MASK

(71) Applicant: Darwin Precisions Corporation, Hsinchu County (TW)

(72) Inventors: Yun-Heng Chen, Hsinchu County (TW); Wen-Yi Lin, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 97 days.

(21) Appl. No.: 17/964,176

(22) Filed: Oct. 12, 2022

(65) Prior Publication Data

US 2023/0037092 A1    Feb. 2, 2023

Related U.S. Application Data

(62) Division of application No. 17/577,046, filed on Jan. 17, 2022, now Pat. No. 11,685,985.

(30) Foreign Application Priority Data

Jun. 11, 2021   (TW) ................. 110121496

(51) Int. Cl.
| | | |
|---|---|---|
| C23C 14/04 | (2006.01) |
| B05C 21/00 | (2006.01) |
| B21B 1/22 | (2006.01) |
| B21H 7/00 | (2006.01) |
| B21H 8/00 | (2006.01) |

(Continued)

(52) U.S. Cl.
CPC .......... *C23C 14/042* (2013.01); *B05C 21/005* (2013.01); *B21B 1/227* (2013.01); *B21H 7/00* (2013.01); *B21H 8/005* (2013.01); *B23P 15/00* (2013.01); *C23C 14/24* (2013.01);
(Continued)

(58) Field of Classification Search
None
See application file for complete search history.

(56) References Cited

U.S. PATENT DOCUMENTS

| 5,105,638 A | 4/1992 | Mito et al. |
| 8,656,859 B2 * | 2/2014 | Hong ................... H10K 71/166 |
| | | 118/504 |

(Continued)

FOREIGN PATENT DOCUMENTS

| CN | 108025581 A | 5/2018 |
| TW | 201840881 A | 11/2018 |

OTHER PUBLICATIONS

Yang et al., "Metal Mask and Inspecting Method Thereof", U.S. Appl. No. 17/523,947, filed Nov. 11, 2021.
(Continued)

*Primary Examiner* — Jethro M. Pence
(74) *Attorney, Agent, or Firm* — WPAT, PC

(57) ABSTRACT

A method of manufacturing a metal mask includes calendering a metal material, so as to form a metal mask substrate, where the metal mask substrate includes a surface and a plurality of grooves formed in the surface, and the grooves all extend in a direction. The surface has at least one sampling region, while at least two grooves are distributed in the sampling region, where an average area ratio of the area of the grooves within the sampling region to the area of the sampling region ranges between 45% and 68%.

3 Claims, 7 Drawing Sheets

(51) Int. Cl.
*B23P 15/00* (2006.01)
*C23C 14/24* (2006.01)
*G03F 7/00* (2006.01)

(52) U.S. Cl.
CPC ....... *G03F 7/0015* (2013.01); *Y10T 29/49826* (2015.01); *Y10T 29/49863* (2015.01)

(56) References Cited

U.S. PATENT DOCUMENTS

| | | | | |
|---|---|---|---|---|
| 8,746,169 | B2* | 6/2014 | Lee | H10K 71/166 |
| | | | | 118/504 |
| 8,881,676 | B2* | 11/2014 | Hong | C23C 14/12 |
| | | | | 118/504 |
| 9,192,959 | B2* | 11/2015 | Hong | C23F 1/02 |
| 9,583,708 | B2* | 2/2017 | Ko | C23C 14/042 |
| 9,666,837 | B2* | 5/2017 | Lee | H10K 71/00 |
| 9,711,724 | B2* | 7/2017 | Baek | C23C 14/042 |
| 9,975,134 | B2* | 5/2018 | Ko | H01J 11/48 |
| 10,014,471 | B2* | 7/2018 | Baek | C23F 1/02 |
| 10,084,133 | B2* | 9/2018 | Chen | B05C 21/005 |
| 10,439,170 | B2* | 10/2019 | Lin | C23C 14/042 |
| 11,578,400 | B2* | 2/2023 | Zhang | H10K 71/166 |
| 11,732,347 | B2* | 8/2023 | Okamoto | C23C 14/042 |
| | | | | 118/712 |
| 2014/0113144 | A1 | 4/2014 | Loth et al. | |
| 2015/0034005 | A1* | 2/2015 | Ko | C23C 14/042 |
| | | | | 118/504 |
| 2018/0065162 | A1 | 3/2018 | Mikami et al. | |
| 2018/0186161 | A1 | 7/2018 | Morikawa et al. | |
| 2019/0337031 | A1 | 11/2019 | Jeon et al. | |
| 2021/0355586 | A1 | 11/2021 | Mikami et al. | |
| 2022/0325397 | A1* | 10/2022 | Miyatani | C23C 14/042 |

OTHER PUBLICATIONS

Lin et al., "Method of Preparing Metal Mask Substrate", U.S. Appl. No. 17/524,076, filed Nov. 11, 2021.

* cited by examiner

METAL MASK

CROSS-REFERENCE TO RELATED APPLICATION

The present application is a Divisional Application of the U.S. application Ser. No. 17/577,046, filed Jan. 17, 2022, which claims priority to Taiwan Application Serial Number 110121496, filed Jun. 11, 2021, all of which are herein incorporated by reference in their entireties.

BACKGROUND

Technical Field

The present disclosure relates to a processing tool configured for patterning and a manufacturing method thereof. More particularly, the present disclosure relates to a metal mask and a manufacturing method thereof.

Description of Related Art

Nowadays, some display panels are manufactured by evaporation and using a metal mask, in which the metal mask has a plurality of openings. During the evaporation, plumes can pass through the openings and be deposited on a target substrate (e.g., a glass plate), so as to form a patterned layer. A conventional metal mask is usually manufactured by photolithography, so that the openings are defined by a photoresist pattern after developing.

Current display panels have been developed towards a high resolution trend. Accordingly, the pitches among the openings of the metal mask need to be reduced, so that the metal mask can be used for manufacturing a high resolution display. However, once the pitches among the openings are reduced, the part of the photoresist pattern covering the area between two adjacent openings will also be reduced, so that the photoresist pattern may not completely cover the area between two adjacent openings during etching, resulting in the subsequent formation of some large and ineligible openings, even multiple openings communicating to each other, thereby causing a finished metal mask that is not suitable for or not capable of manufacturing the high resolution display panel.

SUMMARY

At least one embodiment of the disclosure provides a metal mask, which can be used for manufacturing a display panel.

A metal mask according to at least one embodiment of the disclosure includes a surface, a plurality of grooves and a plurality of openings. The surface has at least one sampling region. The grooves and the openings are formed in the surface, and the grooves all extend in a direction, where an average area ratio of the area of the grooves within the sampling region to the area of the sampling region ranges between 45% and 68%.

When the average area ratio ranges between 45% and 68%, the surface of the metal mask substrate can have suitable roughness, in which the suitable roughness facilitates a qualified metal mask having eligible openings, so that the metal mask can be used for manufacturing the display panel.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
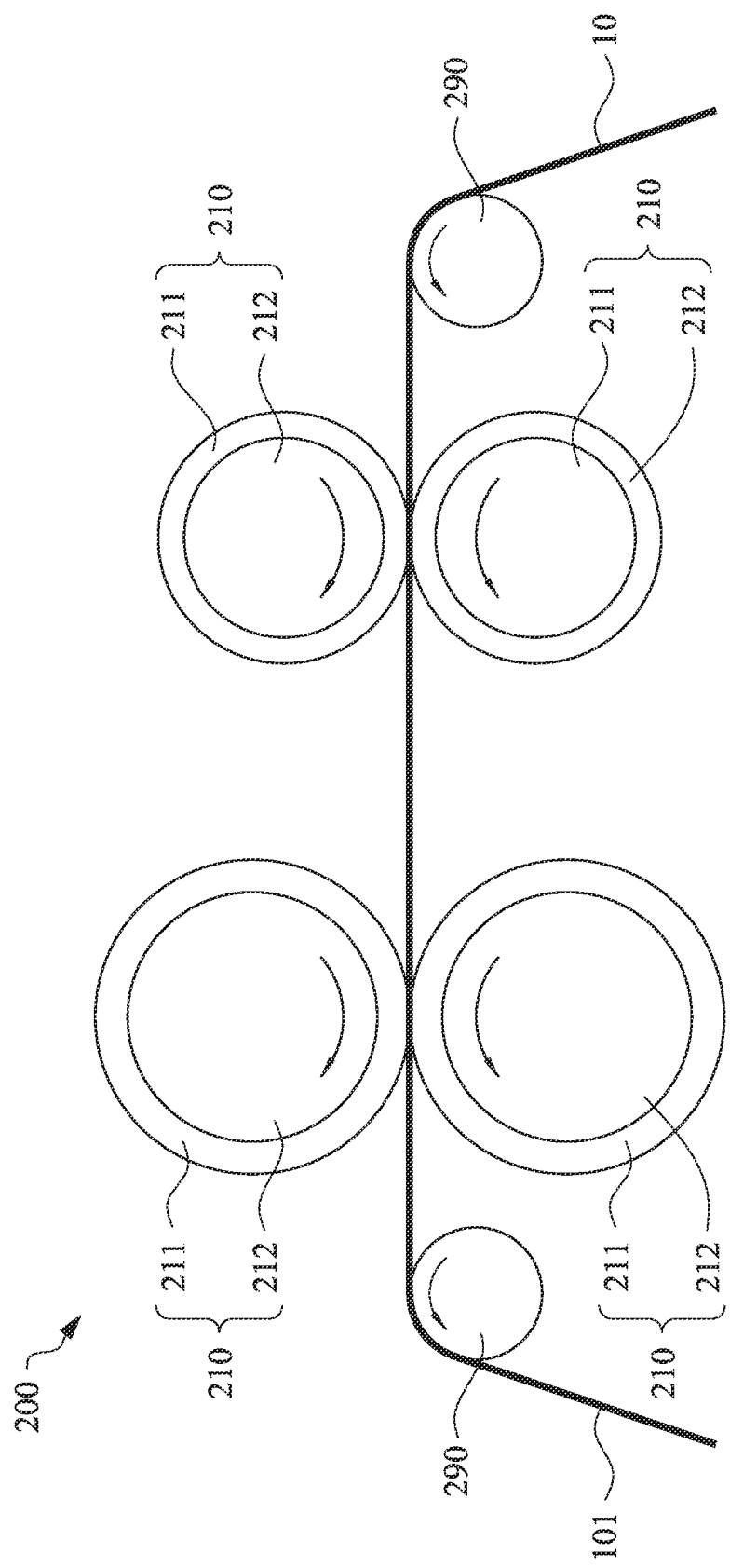
FIG. 1A is a schematic view of a calendering process employed by a method of manufacturing a metal mask according to at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions. Accordingly, the description and explanation of the following embodiments are not limited to the sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

FIG. 1A is a schematic view of a calendering process employed by a method of manufacturing a metal mask according to at least one embodiment of this disclosure. Referring to FIG. 1A, in the method of manufacturing the metal mask according to this embodiment, first, a metal material 10 is calendered, so as to form a metal mask substrate 101. Specifically, the metal material 10 can be fed to a calendering machine 200 for performing calendering, in which the calendering machine 200 includes a plurality of calendering rollers 210 and a plurality of transferring rolls 290.

The metal material 10 can be a flexible metal strip or a rigid metal plate, in which some transferring rolls 290 can pass the metal material 10 between the calendering rollers 210, so that two adjacent rotating calendering rollers 210 can calender the metal material 10 to form a metal mask substrate 101. The other transferring rolls 290 can transfer the metal mask substrate 101 that is calendered, so that the metal mask substrate 101 leaves the calendering rollers 210 and is output from the calendering machine 200.

It is worth mentioning that the calendering machine 200 shown in FIG. 1A can include four calendering rollers 210, in which the four calendering rollers 210 can calender the same metal material 10 in the meanwhile. In addition, in this embodiment, the sizes of at least two calendering rollers 210 can be different. Taking FIG. 1A for example, the sizes of two calendering rollers 210 on the left are significantly larger than the sizes of two calendering rollers 210 on the right. However, in other embodiment, the sizes of the calendering rollers 210 can be substantially the same, and thus, FIG. 1A does not limit the sizes of the calendering rollers 210.

Figure 1B:
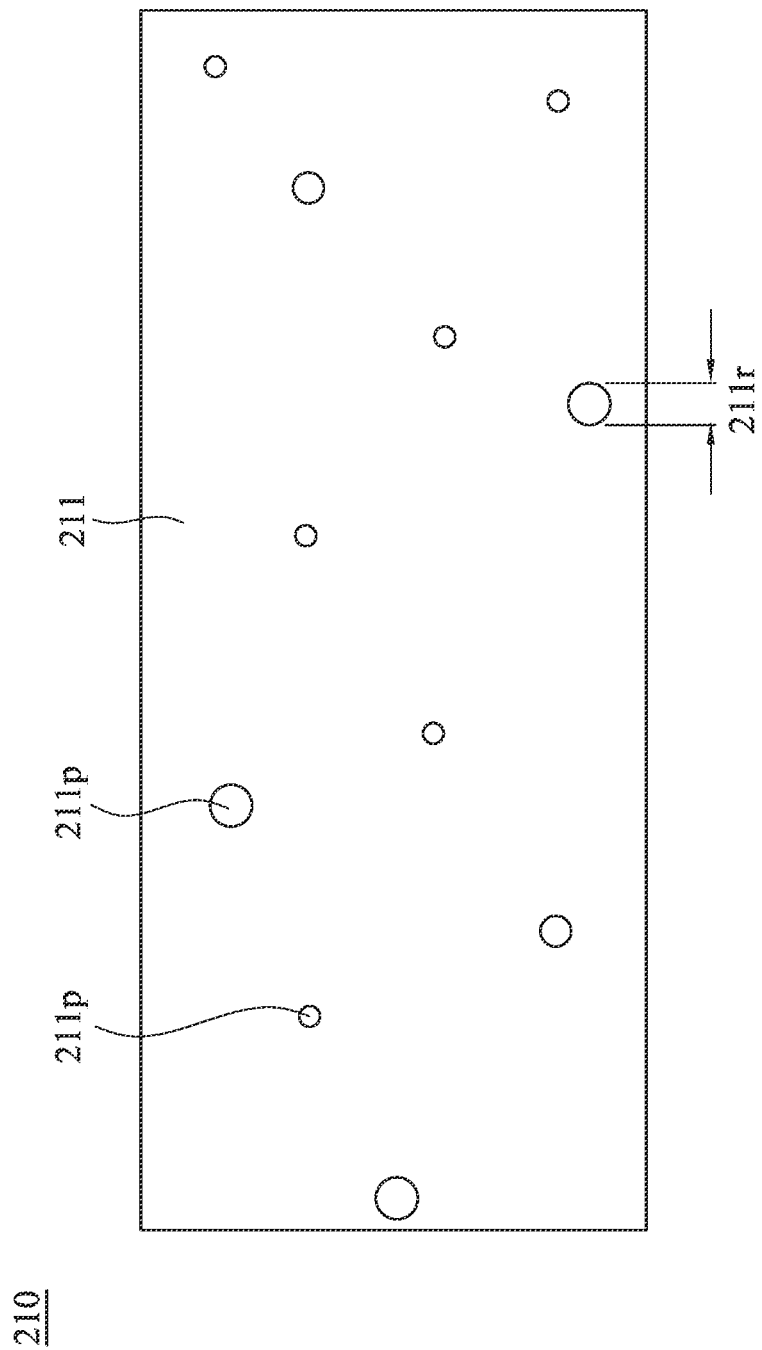
FIG. 1B is a schematic partial enlarged view of the surface of the calendering roller in FIG. 1A.

FIG. 1B is a schematic partial enlarged view of the surface of the calendering roller in FIG. 1A. Referring to FIGS. 1A and 1B, each of the calendering rollers 210 can include a calendering layer 211 and a roller 212. In the same calendering roller 210, the calendering layer 211 covers the outer surface of the roller 212, so that the calendering layer 211 wraps the roller 212, in which the calendering layer 211 can be attached to the roller 212 by adhesive, and the calendering layer 211 can be made of titanium.

There may be a plurality of bumps 211p which can press the metal material 10 formed on the surface of the calendering layer 211, so as to form a plurality of grooves in the surface of the metal material 10. The bumps 211p have various sizes, and the width 211r of the bump 211p can range between 7 μm and 23 μm substantially. Moreover, in this embodiment, the bumps 211p can be arranged irregularly, as shown in FIG. 1B. However, in other embodiment, the bumps 211p also can be arranged regularly, such as in a matrix.

It is necessary to note that the bumps 211p are distributed densely, in fact. However, FIG. 1B is the schematic partial enlarged view of the surface of the calendering roller 210, and FIG. 1B is the simplified drawing of the surface of the calendering roller 210. For example, the quantity of the bumps 211p is reduced, so that FIG. 1B can show the bumps 211p simply and clearly, thereby facilitating marking the bump 211p and the width 211r. Therefore, FIG. 1B is merely for illustration and not intended to accurately depict the actual appearance of the surface of the calendering roller 210.

Figure 2A:
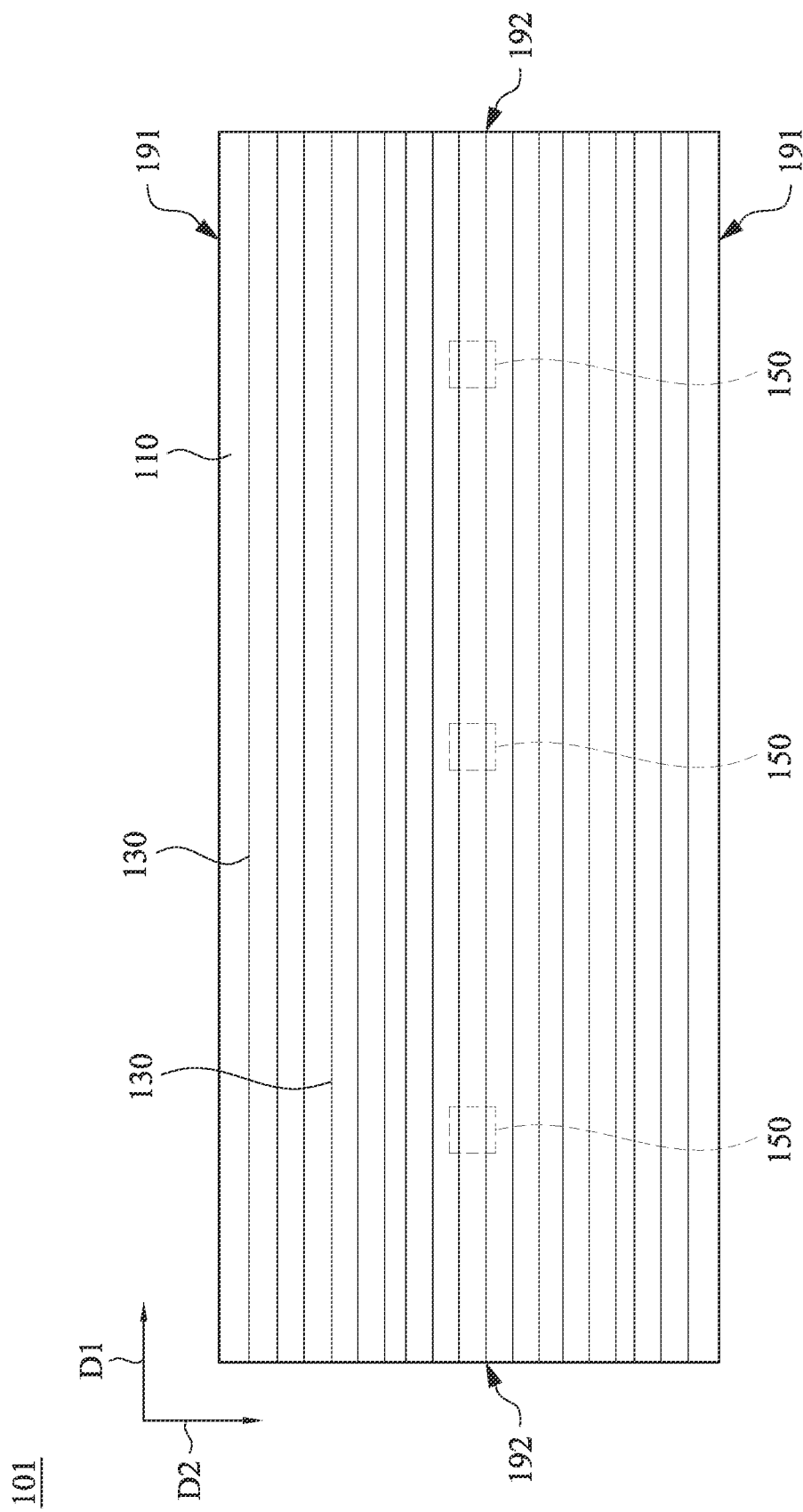
FIG. 2A is a schematic top view of the metal mask substrate formed via the calendering process in FIG. 1A.

FIG. 2A is a schematic top view of the metal mask substrate formed via the calendering process in FIG. 1A. Referring to FIG. 2A, the metal mask substrate 101 includes a surface 110 and a plurality of grooves 130 formed in the surface 110, where the grooves 130 are formed by the calendering rollers 210 pressing the metal material 10. Thus, the grooves 130 all extend in the same direction. Taking FIG. 2A for example, the grooves 130 can be distributed side by side and all extend in a first direction D1.

The metal mask substrate 101 further includes a pair of long sides 191 opposite to each other and a pair of short sides 192 opposite to each other, in which the long sides 191 are connected to the short sides 192. In this embodiment, the extending direction of the long sides 191 can be substantially parallel to the first direction D1, whereas the extending direction of the short sides 192 can be substantially parallel to a second direction D2, where the first direction D1 can be substantially perpendicular to the second direction D2.

It is necessary to note that as seen from the embodiment shown in FIG. 2A, each of the grooves 130 has the length basically equal to the length of the long side 191. However, in other embodiment, the length of at least one of the grooves 130 can be shorted than the length of the long side 191. For example, during the above calendering process, the multiple bumps 211p can stamp at least two collinear grooves 130 which are not connected. Accordingly, the length of one of the grooves 130 shown in FIG. 2A can be shorter than the length of the long side 191 and may be not equal to the length of the long sides 191.

In addition, since the bumps 211p in the same calendering roller 210 are actually distributed densely, the side-by-side grooves 130 are also distributed densely. However, FIG. 2A is the simplified drawing of the grooves 130. For example, the quantity of the grooves 130 is reduced, so as to show the grooves 130 simply and clearly. Hence, FIG. 2A is merely for illustration and not intended to accurately depict both the actual appearance and the real distribution of the grooves 130.

Then, at least one sampling region 150 is selected from the surface 110 of the metal mask substrate 101, so that the surface 110 has at least one sampling region 150. The sampling region 150 can be marked on the surface 110, i.e., the sampling region 150 is visible. Alternatively, the sampling region 150 can be not marked on the surface 110, i.e., the sampling region 150 is invisible.

For example, the sampling region 150 can be selected by an instrument, where the instrument can be an optical measurement instrument, such as optical microscope or optical dimension measuring device. The optical measurement instrument can directly select at least one sampling region 150 from the surface 110 of the metal mask substrate 101 without any mark, so the sampling region 150 cannot be seen by human eye.

In the embodiment shown in FIG. 2A, a plurality of sampling regions 150 are selected from the surface 110 of the metal mask substrate 101, so that the surface 110 has a plurality of sampling regions 150, in which the sampling regions 150 can be distributed along the long sides 191, i.e., the sampling regions 150 can be distributed in the first direction D1. However, in other embodiment, only one sampling region 150 is selected from the surface 110, i.e., the surface 110 has only one sampling region 150. Hence, the quantity of the sampling region 150 which the surface 110 has can be only one and not limited by FIG. 2A.

Figure 2B:
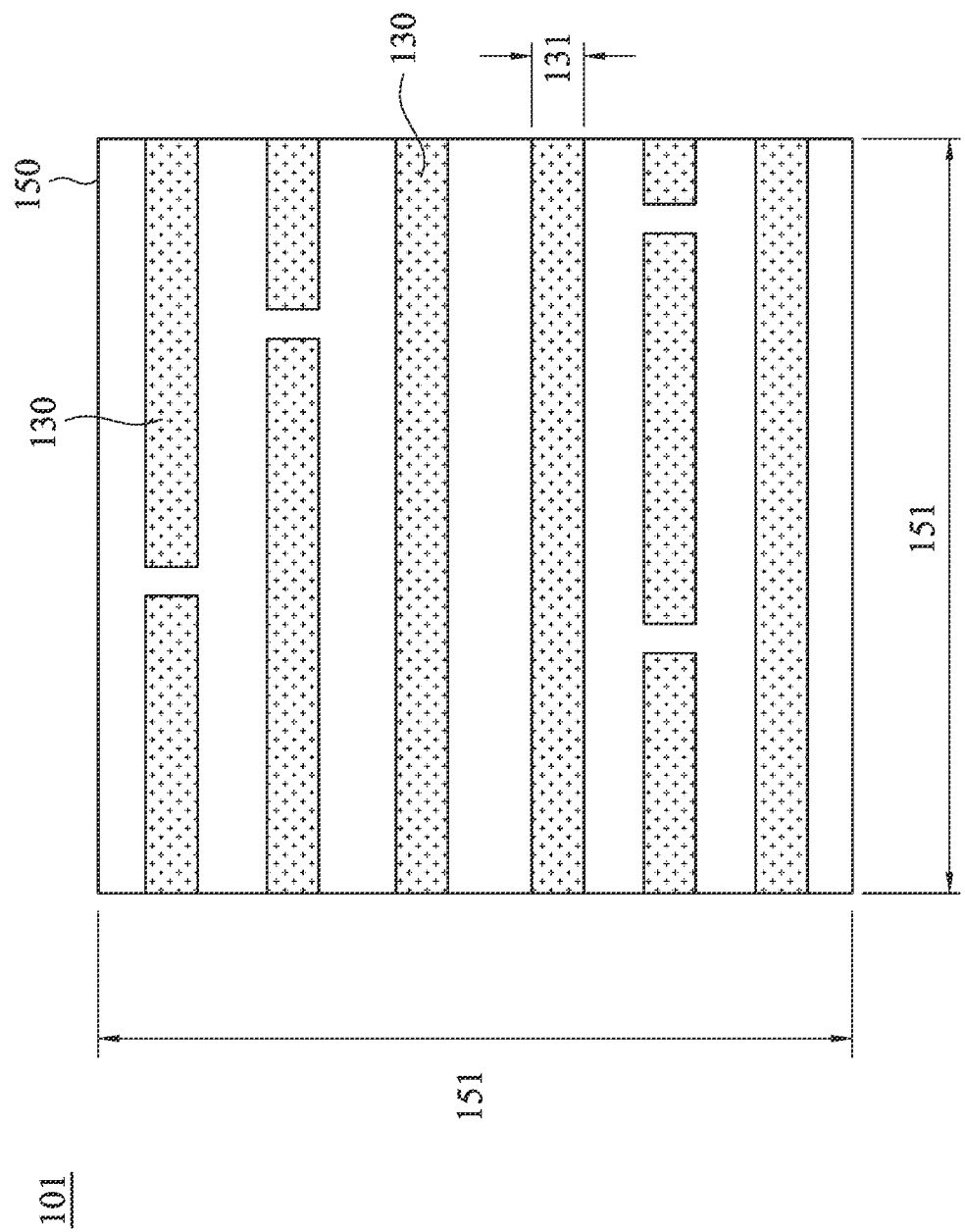
FIG. 2B is a schematic top view within one of the sampling regions of the metal mask substrate in FIG. 2A.

FIG. 2B is a schematic top view within one of the sampling regions of the metal mask substrate in FIG. 2A. Referring to FIGS. 2A and 2B, the multiple grooves 130, i.e., at least two grooves 130, can be distributed in each of the sampling regions 150, so there are at least two side-by-side and noncollinear grooves 130 formed in one of the sampling regions 150, as shown in FIG. 0.2B.

In this embodiment, the sampling region 150 can take the shape of a square substantially, in which the side 151 of the sampling region 150 may be about 5 mm, for example. In other words, the sampling region 150 can take the shape of a 5 mm×5 mm square substantially. The grooves 130 can be formed by the bumps 211p pressing the metal material 10, so that the width 131 of each of the grooves 130 is basically equal to the width 211r of the bump 211p (referring to FIG. 1B). Thus, the width 131 of each of the grooves 130 can range between 7 μm and 23 μm.

It is necessary to note that the width 131 of each of the grooves 130 can range between 7 μm and 23 μm, and the side 151 of the sampling region 150 can be about 5 mm, so that FIGS. 2A and 2B apparently do not depict the sampling regions 150 and the grooves 130 on the same scale according to real size. Furthermore, the grooves 130 shown in FIG. 2B are also not drawn to scale based on enlarging FIG. 2A. Hence, FIGS. 2A and 2B are not intended to accurately depict the grooves 130 and the sampling regions 150, and both the grooves 130 and the sampling regions 150 shown in FIGS. 2A and 2B are merely for illustration to help to describe the grooves 130 and the sampling regions 150.

In addition, since the bumps 211p of the calendering roller 210 are distributed densely in fact, so that one of the grooves 130 can be formed by the multiple bumps 211p calendering the metal material 10. Hence, the shape of one single groove 130 is a bar, but the shape may not be a rectangle. For example, one single groove 130 can be formed by a plurality of circular and/or elliptical holes which are arranged in a line and connected, so that the groove 130 can have an undulate edge and a significantly inconstant width. Thus, the grooves 130 shown in FIG. 2B are merely for illustration to help to describe structural features of this embodiment and not intended to accurately depict the grooves 130.

After one or more sampling regions 150 are selected, an average area ratio of the area of the grooves 130 within each sampling region 150 to the area of the sampling region is measured and obtained. During measuring and obtaining the average area ratio, first, in the same sampling region 150, the area of the grooves 130 within the sampling region 150 and the area of the sampling region 150 can be measured and obtained, where the area of the grooves 130 is equal to the sum of areas of the grooves 130 within the same sampling region 150.

Taking FIG. 2B for example, first, the area of the sampling region 150 shown in FIG. 2B (i.e., side 151× side 151) and the area of all of the grooves 130 within the sampling region 150 can be measured. Then, an area ratio defined by the area of all of the grooves 130 within the sampling region 150 and the area of the sampling region 150 is calculated. For example, in FIG. 2B, the area of the sampling region 150 is A, and the area of all of the grooves 130 within the sampling region 150 is T, in which the area ratio is equal to T/A.

According to the area ratio defined by the area of the grooves within the sampling region and the area of the sampling region, the average area ratio can be known. In detail, according to the definition of the area ratio, the area ratios of the sampling regions 150 are measured and obtained. Afterwards, an average of the area ratios of the sampling regions 150 is calculated, where the average is equal to the average area ratio and may be an arithmetic mean.

Afterwards, the average area ratio is determined whether it is within an eligible range, so as to determine the metal mask substrate 101 can be ready for subsequent process, in which the eligible range is between 45% and 68%, for example. When the average area ratio is within the eligible range, e.g., between 45% and 68%, it means that the surface 110 of the metal mask substrate 101 has suitable roughness, thereby facilitating the subsequent process, such as photolithography.

Figure 3A:
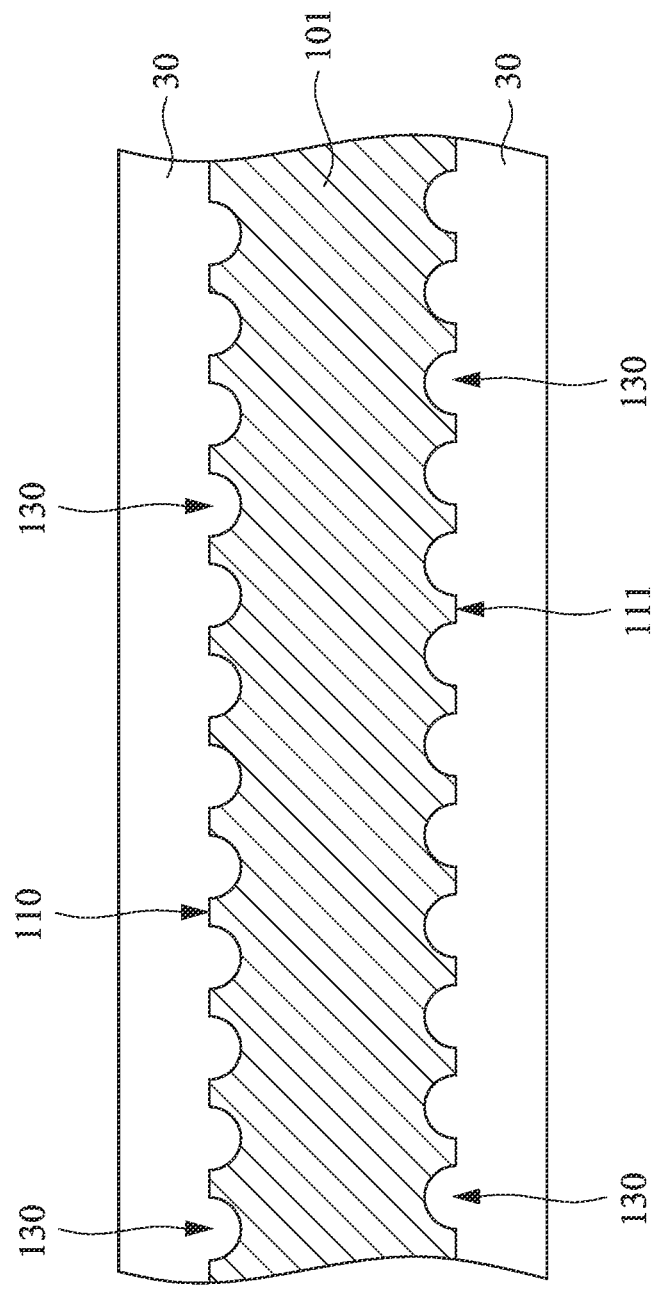
FIGS. 3A and 3B are schematic cross-sectional views of the metal mask substrate in FIG. 2A during photolithography.
Figure 3B:
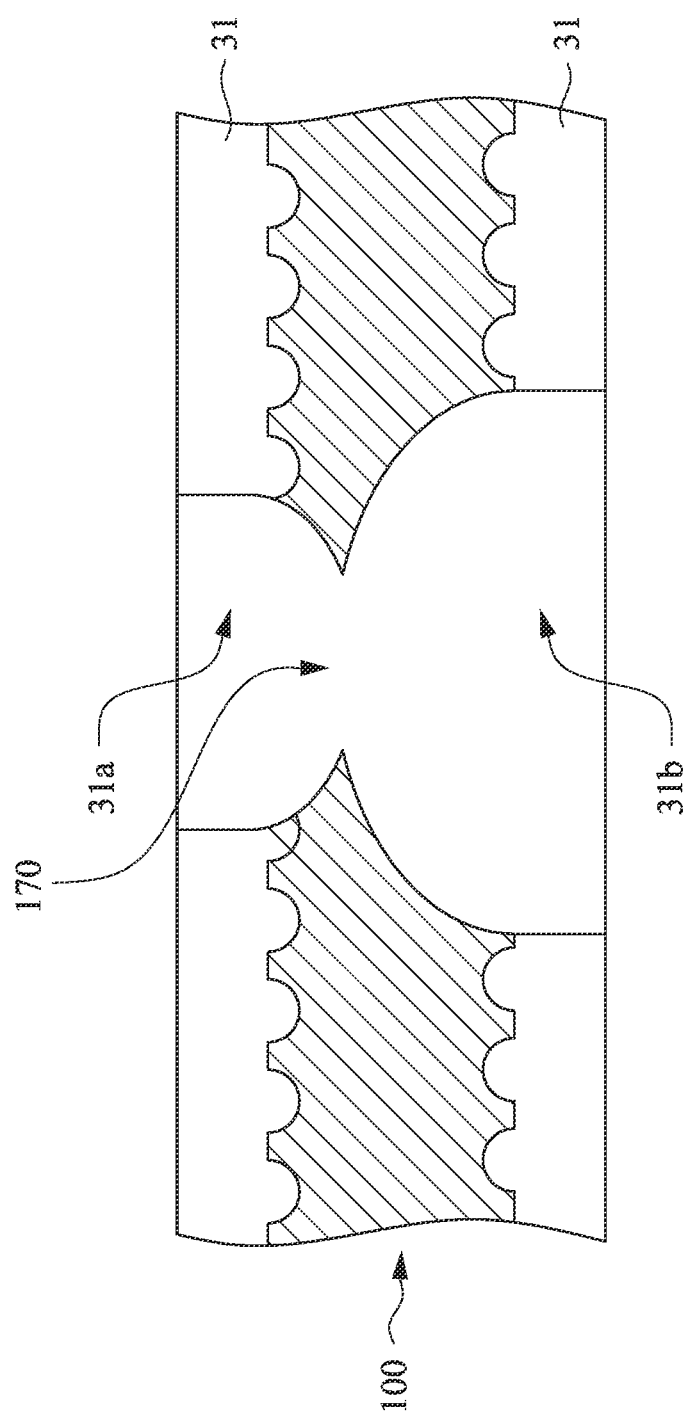

FIGS. 3A and 3B are schematic cross-sectional views of the metal mask substrate in FIG. 2A during photolithography. Referring to FIG. 3A, first, an initial photoresist layer 30 can be formed on the surface 110 of the metal mask substrate 101 during the photolithography. Since the surface 110 has the suitable roughness, the initial photoresist layer 30 covering the surface 110 can be firmly attached to the surface 110.

Referring to FIGS. 1A and 3A, in particular, in this embodiment, the metal material 10 can be calendered by two adjacent and rotating calendering rollers 210, where each of the calendering rollers 210 has a plurality of bumps 211p, so two opposite surfaces (including the surface 110) of the metal mask substrate 101 have a plurality of grooves 130 apiece. Taking FIG. 3A for example, the metal mask substrate 101 further has a surface 111 opposite to the surface 110, in which a plurality of (e.g., at least two) grooves 130 are also formed in the surface 111.

Like the surface 110, the surface 111 also has at least one sampling region, where both the sampling region 150 and the sampling region of the surface 111 can have the same sizes and shapes. Moreover, the method of measuring and obtaining the average area ratio from the surface 111 is also the same as the method of measuring and obtaining that from the surface 110, and thus not described again.

After the average area ratio is obtained from the surface 111, the average area ratio (obtained from the surface 111) is determined whether it is within an eligible range, which may also be between 45% and 68%. When each of the average area ratios of both the surfaces 110 and 111 ranges between 45% and 68%, it means that both the surfaces 110 and 111 have suitable roughness, so that two initial photoresist layers 30 can cover and be attached to the surfaces 110 and 111 firmly.

Referring to FIG. 3B, afterwards, the initial photoresist layers 30 are developed, so as to form two photoresist patterns 31, in which the photoresist patterns 31 have a plurality of holes 31a and 31b (where FIG. 3B shows only one hole 31a and one hole 31b). In the embodiment shown in FIG. 3B, the upper photoresist pattern 31 has the plurality of holes 31a exposing the surface 110, and the lower photoresist pattern 31 has the plurality of holes 31b exposing the surface 111, wherein the size of the hole 31a is apparently smaller than the size of the hole 31b.

After the photoresist patterns 31 are formed, by using the photoresist patterns 31 as masks, the metal mask substrate 101 is etched, so that a plurality of the openings 170 (FIG. 3B shows one opening 170) are formed in the surfaces 110 and 111 of the metal mask substrate 101, thereby forming a metal mask 100, in which each of the openings 170 extends from the surface 110 to the surface 111. In other words, the openings 170 are formed by passing through the metal mask substrate 101.

Since each of the surfaces 110 and 111 has the suitable roughness, not only the initial photoresist layers 30 can cover and be attached to the surfaces 110 and 111 firmly, but also the photoresist patterns 31 can cover and be attached to the surfaces 110 and 111 firmly. Therefore, during etching the metal mask substrate 101, the photoresist patterns 31 can effectively block the etchant from entering the area except the holes 31a and 31b of the photoresist patterns 31, so that the sizes and the shape of two ends of the opening 170 can be substantially the same as the sizes and the shapes of the holes 31a and 31b.

Figure 3C:
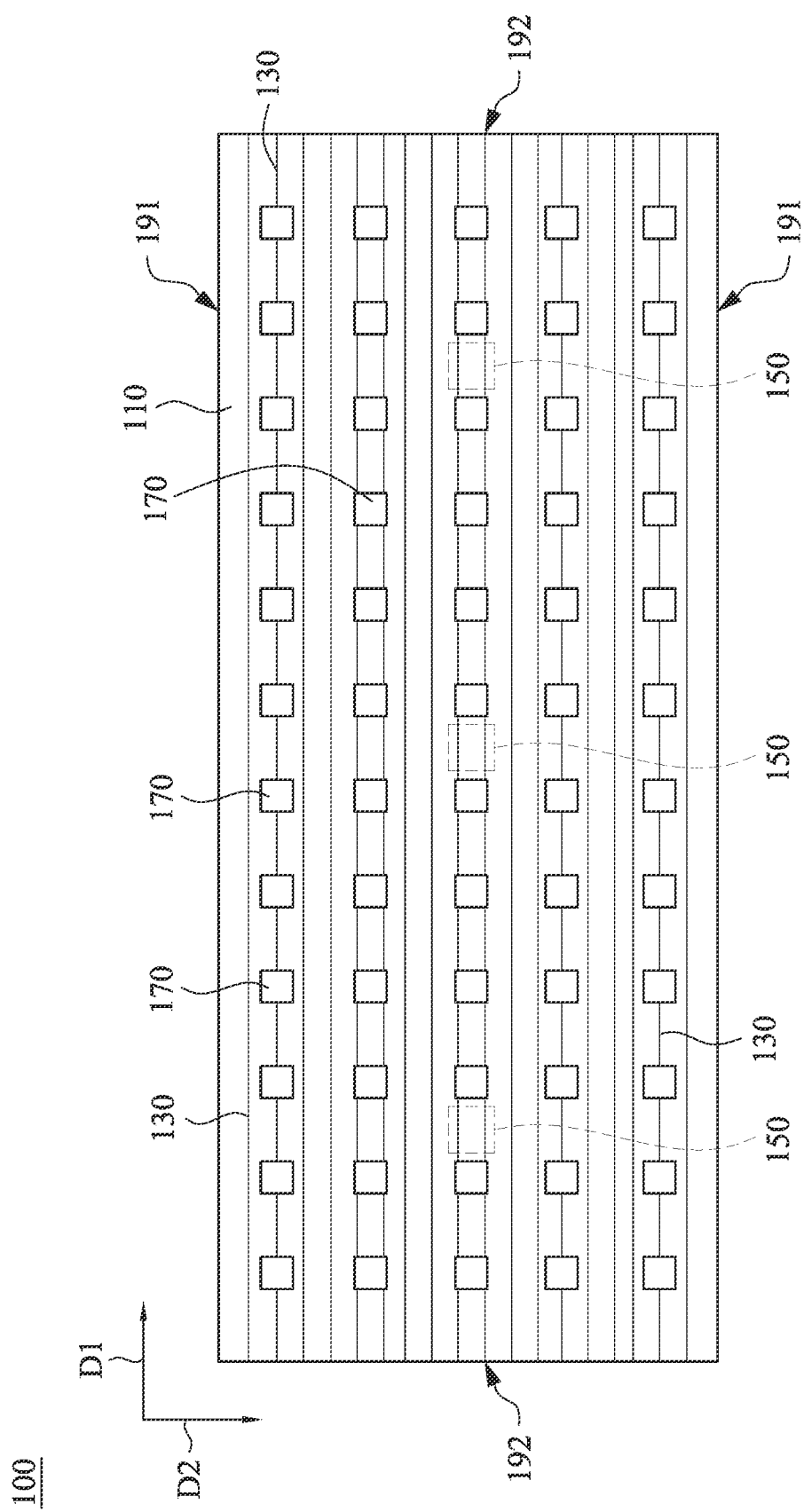
FIG. 3C is a schematic top view of the metal mask in FIG. 3B.

FIG. 3C is a schematic top view of the metal mask in FIG. 3B. Referring to FIGS. 3B and 3C, afterwards, the photoresist patterns 31 are removed, so that both the surfaces 110 and 111 can appear. So far, a metal mask 100 including the surfaces 110 and 111, the pair of the long sides 191, the pair of the short sides 192, the plurality of grooves 130 and the plurality of openings 17 is basically complete.

Since the surfaces 110 and 111 are still covered by the photoresist patterns 31 during etching the metal mask substrate 101, both the metal mask 100 and the metal mask substrate 101 include the grooves 130 which basically have the same width (e.g., the width 131 shown in FIG. 2B), while the average area ratios measured and obtained from the surfaces 110 and 111 of the metal mask 100 are also within the eligible range, such as between 45% and 68%.

It is worth mentioning that in the embodiment shown in FIGS. 3A and 3B, the initial photoresist layers 30 are all developed to form the photoresist patterns 31. However, one of the calendering rollers 210 in FIG. 1A can have no bump 211p, so that only one side of the metal material 10 is pressed by the bumps 211p, whereas the other side of the metal material 10 is not pressed by any bump 211p. Accordingly, the grooves 130 can be formed only in one side of the metal mask substrate 101, for example, formed only in the surface 110, not in the surface 111.

When the grooves 130 are only formed in the surface 110, the initial photoresist layer 30 covering the surface 111 cannot be developed, so that the initial photoresist layer 30 can keep covering the surface 111 during etching the metal mask substrate 101, thereby preventing the etchant in contact with the surface 111. Thus, the hole 31b shown in FIG. 3B can be omitted, and the openings 170 can be formed by etching only one side (e.g., surface 110) of the metal mask substrate 101.

Consequently, when the average area ratio obtained based on the sampling region is within the eligible range (e.g., between 45% and 68%), the surface of the metal mask substrate has the suitable roughness, so that during photolithography, the photoresist pattern can cover and be attached to the surface of the metal mask substrate firmly. Therefore, the plurality of openings of the metal mask can be basically formed depending on the holes of the photoresist pattern completely, so as to reduce or avoid the ineligible openings, thereby causing the metal mask suitable for manufacturing display panel, especially manufacturing high resolution display.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A metal mask, comprising:
   a surface, consisting of a plurality of sampling regions, wherein each of the plurality of sampling regions has a same area;
   a pair of long sides, opposite to each other, wherein an extending direction of the long sides is parallel to a first direction;
   a pair of short sides, opposite to each other, wherein an extending direction of the short sides is parallel to a second direction, and the first direction is perpendicular to the second direction, wherein an area of the surface is defined by the long sides and the short sides;
   a plurality of grooves formed in the surface, and all extending in the first direction, wherein for each of the plurality sampling regions, an average area ratio of an area of the plurality of grooves within the sampling region to an area of the sampling region ranges between 45% and 68%, thereby increasing a suitable roughness of the surface configured to facilitate a subsequent process of the metal mask, wherein a width extending in the second direction of each of the plurality of grooves ranges between 7 μm and 23 μm; and
   a plurality of openings, formed in the surface.

2. The metal mask of claim 1, wherein the plurality of grooves are formed by pressing the metal mask with a calendering roller having a plurality of bumps.

3. The metal mask of claim 1, wherein the subsequent process is photolithography.

* * * * *